United States Patent [19]

Nishizawa et al.

[11] Patent Number: 5,045,499

[45] Date of Patent: Sep. 3, 1991

[54] METHOD OF MANUFACTURING A DISTRIBUTED BRASS REFLECTOR TYPE SEMICONDUCTOR LASER

[75] Inventors: Hideaki Nishizawa; Mitsuo Takahashi, both of Osaka; Yasuharu Suematsu, Kawasaki, all of Japan

[73] Assignees: Research Development Corporation of Japan, Tokyo; Sumitomo Electric Industries, Ltd., Osaka; Tokyo Institute of Technology, Tokyo, all of Japan

[21] Appl. No.: 412,422

[22] Filed: Sep. 26, 1989

Related U.S. Application Data

[62] Division of Ser. No. 239,120, Aug. 31, 1988, Pat. No. 4,914,670.

[30] Foreign Application Priority Data

Sep. 1, 1987 [JP] Japan .................. 62-218461

[51] Int. Cl.⁵ .................. H01L 21/20; H01L 21/203
[52] U.S. Cl. .................. 437/129; 148/DIG. 95; 148/DIG. 119; 156/654; 156/662; 437/81; 437/133
[58] Field of Search .................. 148/DIG. 5, 50, 56, 148/65, 72, 95, 97, 110, 106, 119, 111, 169; 156/610–614, 699, 651, 652, 657, 662, 654, 656; 357/16, 17; 372/43, 44, 45, 46, 96; 437/81, 89, 90, 105, 107, 126, 129, 133, 905, 936, 976, 981

[56] References Cited

U.S. PATENT DOCUMENTS

| 4,575,919 | 3/1986 | Logan et al. ............... 437/129 |
| 4,662,988 | 5/1987 | Renner ............... 156/659.1 |
| 4,815,087 | 3/1989 | Hayashi ............... 372/45 |
| 4,830,986 | 5/1989 | Plumb ............... 437/129 |
| 4,835,117 | 5/1989 | Ohba et al. ............... 437/129 |

FOREIGN PATENT DOCUMENTS

| 0111284 | 9/1981 | Japan ............... 437/129 |
| 0043428 | 3/1982 | Japan ............... 437/129 |
| 0227177 | 12/1984 | Japan ............... 437/129 |
| 0166087 | 7/1986 | Japan ............... 372/43 |
| 0171190 | 8/1986 | Japan ............... 372/96 |
| 0114190 | 5/1988 | Japan ............... 437/129 |

OTHER PUBLICATIONS

Aoli et al., ". . . Distributed Reflector (DR) Laser with High-Low Reflection Grating Structure", Electron. Lett., vol. 25, No. 24, Nov. 23, 1989, pp. 1650-1651.
Choi et al., "A New-Type . . . BIG-DBR Laser by an Island-Type Mesa Process", Jpn. J. Appl. Phys. 2, Lett., vol. 26, No. 10, Oct. 1987, pp. L1593-L1596.
Tohmori et al., "Bundle-Integrated-Guide (BIG) Distributed-Bragg-Reflector (DBR) Lasers", Trans. Inst. Electron. Inf. 8 Commun. eng. E, May 1987, vol. E70, No. 5, pp. 494-503.
Y. Tohmori et al., Japanese Journal of Applied Physics, vol. 24, No. 5, Jun. 1985, pp. L339-L401.
Y. Abe et al., Electronic Letters, Dec. 10, 1981, vol. 25/26, pp. 945-947.
T. P. Pearsall, ed., GaInAsP Alloy Semiconductors, (John Wiley & Sons), pp. 346-353.

Primary Examiner—Olik Chaudhuri
Assistant Examiner—William Bunch
Attorney, Agent, or Firm—Kenyon & Kenyon

[57] ABSTRACT

Disclosed are a distributed Bragg reflector type semiconductor laser and a method of manufacturing such a laser a high yields, in which the upper surface of an active waveguide is covered by an external waveguide, the external waveguide at side portions thereof, the external waveguide is coupled with the edge surfaces of the active waveguide without any gap remaining, and the coupling ratio of the active waveguide and external waveguide is high.

6 Claims, 4 Drawing Sheets

METHOD OF MANUFACTURING A DISTRIBUTED BRASS REFLECTOR TYPE SEMICONDUCTOR LASER

This is a division of application Ser. No. 239,120 filed Aug. 31,. 1988, U.S. Pat. No. 4,914,670.

FIELD OF THE INVENTION

The present invention relates to a distributed Bragg reflector type semiconductor laser and a method of manufacturing such a laser.

A distributed Bragg reflector type semiconductor laser of the type called BIG-DBR is one type of semiconductor laser which, because of its excellent performance, is at present regarded as a superior class of laser.

This type of laser was proposed by Tohmori et al. in "Japanese Journal of Applied Physics", Vol. 24, No. 6, 1985, pages 399 to 401. The present invention relates to an improvement of this laser.

DESCRIPTION OF RELATED BACKGROUND ART

With a light source having a wavelength of a band of 1.55 μm which is intended to provide a form of light communication over long distances with a large capacity, it is required that it has a single longitudinal mode which is stable, that it can be monolithically integrated with other functional devices with ease, and so on.

A dynamic single mode laser is a suitable form of laser which can satisfy these conditions.

Dynamic single mode laser is include distributed feedback type lasers (DFB), distributed Bragg reflector type lasers (DBR), compound resonator lasers, and so on.

Among these, the distributed Bragg reflector type laser is of particular interest.

In a distributed Bragg reflector type laser, a diffraction grating is formed on a waveguide and used as a distributed Bragg reflector.

This kind of laser has many advantages such as the fact that the stable single longitudinal mode operation can be easily maintained upon high speed modulation, that the laser can be monolithically integrated with other functional devices with case, that a length of a laser resonator can be set to a short cavity, and so forth.

Distributed Bragg reflector type lasers are mainly classified as DBR-ITG type lasers which have an integrated twin-waveguide structure and DBR-BJB type lasers which have a direct coupling structure.

The first of these type is the Distributed Bragg reflector integral twin-guide type laser which has two waveguides. An external waveguide is extended to the outside. An active waveguide is formed over that waveguide through a buffer layer. The distributed Bragg reflector surface is provided on the external waveguide.

This kind of laser involves the problem that part of the light is reflected between the active waveguide and the external waveguide. That is, there is a problem since the active waveguide is formed over the external waveguide and the coupling state therebetween is therefore inferior and the reflection loss in the coupling portion is large.

In a DBR-BJB type laser, both the active waveguide and the external waveguide are arranged in an almost rectilinear configuration. Namely, neither of the waveguides exist in the vertical direction but are arranged in the same plane; thus the reflection loss in the coupling portion is small.

In actual practice, however, a level difference can easily occur at the boundary between the two waveguides. There are certain drawbacks in that the active waveguide and external waveguide are incompletely coupled in the level difference portion and the light is reflected by this level difference portion.

Due to this reflection loss, the coupling efficiency between these waveguides is low. Consequently, the conventional DBR type lasers experience problems in that multi-mode oscillation can easily occur and the differential quantum efficiency is low.

With a view to solving these problems, Suematsu, Arai, Tohmori, et al invented the distributed Bragg reflector type (BIG-DBR type) semiconductor laser, their patent application therefor (Japanese Patent Application No. 60-12181, JP-A-61-171190) having been filed on Jan. 25, 1985, and laid open on Aug. 1, 1986.

The laser has a waveguide structure wherein an active waveguide is surrounded by an external waveguide.

In the central portion of this structure, the external waveguide is provided over the active waveguide (which is opposite to the case of the ITG type laser), while in the side portions, the external waveguide is disposed over an extended surface of the active waveguide. Thus the active waveguide and external waveguide are coupled in two directions, i.e., in the vertical direction and in the direction of the horizontal surface, whereby the coupling efficiency is improved. In actual practice, however, there is a serious problem with respect to the yields obtainable with this laser.

This point will now be explained with reference to FIGS. 8 to 11, which are cross-sectional views showing the manufacturing steps.

An InGaAsP active waveguide 12 and an InP depression layer 13 are sequentially formed on an p-type InP (100) substrate 11 by a liquid phase epitaxial method.

Next, the InP depression layer 13 and InGaAsP active waveguide layer 12 are etched with the central portions retained. At this time, a part of the upper surface of the InP substrate 11 is also etched.

A grating 16 is formed on the upper surface of the exposed InP substrate 11. FIG. 8 is a cross-sectional view showing the state of a laser formed by the foregoing steps.

As will be understood from FIG. 8, an edge surface U of the InP depression layer 13 and an edge surface W of the InGaAsP active waveguide 12 form one flush surface. This surface will be parallel to or slightly inclined from a (110) cleavage plane.

An InGaAsP external waveguide layer 14 is then formed on the depression layer 13 by the liquid phase epitaxial method.

It is desirable that the external waveguide layer 14 is so formed as to uniformly cover the upper surfaces of both the substrate 11 and the depression layer 13.

However, there is a problem in that the InGaAsP external waveguide layer 14 is not properly formed in the immediate vicinity of the InGaAsP active waveguide layer 12 and InP depression layer 13.

FIG. 9 shows such an improper state.

The external waveguide layer 14 grows in an epitaxial manner on the InP substrate 11 and also on the depression layer 13.

However, in the regions near the edge surfaces U of the depression layer 13 and the edge surfaces W of the active waveguide 12, the layer 14 hardly grows at all and gap portions G remain.

FIG. 10 is a cross-sectional view showing a state similar to FIG. 9. The edge surfaces U and W of the depression layer and active waveguide are slightly inclined in the direction toward the (111) plane. Actually, although it is unclear whether the edge surfaces U and W are inclined in the direction of the (110) plane or the (111) plane, in either case the external waveguide layer fails to grow in a state in which it intimately connects with the edge surfaces W and U.

FIG. 11 shows a special example of FIG. 9. It will be understood from this diagram that the InGaAsP external waveguide layer 14 is continuously formed without any gap at the edge surfaces U and W, but even in this continuous state dimples 18 remain.

In the case of the example shown in FIG. 11 the InGaAsP external waveguide layer 14 is continuously formed on the InP depression layer 13 and InP substrate 11, and the active waveguide and external waveguide are continuous with the edge surfaces W. However, although both the waveguides are coupled and the light in the active waveguide can be transmitted to the external waveguide, it is difficult to obtain a proper coupling state between them due to the influence of the dimples.

Lasers with structures of the described above have in fact been manufactured and, as shown in FIGS. 9 and 10, the external waveguide is interrupted on both sides of the active waveguide with gaps remaining. Almost all of the manufactured lasers of this type are like this. Since the coupling efficiency is 0, these products cannot function as lasers. There have been cases where lasers of the type shown in FIG. 11 have been produced at a low yield. However, the yield is only a few % and it is difficult to manufacture products which can be used as lasers in practice.

The reason why the external waveguide is cut each side of the active waveguide and depression layer is unclear. A possible reason is that the edge surfaces U of the depression layer and the edge surfaces W of the active waveguide are in the (111) mesa directional plane. There is a possibility that such edge surfaces are oblique surfaces as shown in FIG. 10.

It is a known fact that in liquid phase epitaxy crystal growth hardly ever occurs in the (111) mesa directional plane of InP.

SUMMARY OF THE INVENTION

It is an object of the present invention to provide a method of manufacturing at a good yield a laser of the BIG-DBR type in which the external waveguide is coupled with the active waveguide at the edge surfaces without any gap remaining in such as laser in which an external waveguide covers the upper surface of an active waveguide and in which the external waveguide extends on the same surface as the active waveguide at its side portion.

Another object of the invention is to provide a BIG-DBR type laser having high coupling efficiency between the active waveguide and the external waveguide.

The inventors of the present invention have made great efforts by trial and error to find a method of securely coupling the active waveguide layer and external waveguide layer in the horizontal direction.

They have found that the waveguides can be coupled with certainty by a method in which the edge surfaces U of a depression layer are extended on both sides so as to project beyond the edge surfaces W of the external waveguide layer.

FIG. 1 shows a vertical sectional view of a basic type of distributed Bragg reflector type laser according to the present invention. FIG. 1 is a diagram of the principle; in practice other semiconductor layers are also laminated.

The structure of this laser will be described with reference to FIG. 1.

An active waveguide 3-1 and a depression layer 4-1 are sequentially formed on a substrate 1-1 and grown in an epitaxial manner similar to the conventional lasers shown in FIGS. 8 to 11.

When the side portions of the active waveguide layer 3-1 and depression layer 4-1 are removed by etching in this invention, the lower edge surfaces of the active waveguide layer 3-1 are deeply etched by a selective etching method.

Namely, the lower edge surfaces W of the active waveguide layer 3-1 are located at backward positions and the upper edge surfaces U of the depression layer 4-1 are projected forward beyond the edge surfaces W.

Such a structure is called an overhang in the field of architecture. This structure of the active waveguide layer 3-1 and depression layer 4-1 is hereinafter referred to as an overhang in this specification.

The projection length L of the edge surface U beyond the edge surface W is called an overhang length. The overhang length is set at about 0.2 to 1.0 μm.

With such an overhang structure, the edge surfaces of the active waveguide layer 3-1 and depression layer 4-1 do not become a flush surface. A rectangular space Σ is formed whose surfaces in the three directions are surrounded by a back surface R of the depression layer 4-1, edge surface W of the active waveguide layer 3-1, and an upper surface Q of the substrate 1-1.

Due to the existence of the space Σ, when an external waveguide layer 7-1 is formed by a liquid phase epitaxial method, no air gap i formed between the external waveguide layer 7-1 and the active waveguide layer 3-1.

It should be noted that the solution used as the material for forming the external waveguide 7-1 enters this internal space Σ by the liquid phase epitaxial method and this material grows in an epitaxial manner in this space. It is considered that, as shown in FIGS. 8 to 11, in the case of configuration wherein the active waveguide layer 3-1 is exposed to the outside, the InGaAsP eiptaxial layer will grow easily. However, in general, the mechanism of the epitaxial growth can be described by what is called a Kossel model with the growth progressing two-dimensionally by supplying steps and kinks.

With the structure of the short active waveguide layer 3-1 as shown in FIG. 1, by supplying the steps (growth nuclei), the solution comes into contact with the edge surfaces W of the active waveguide layer, and two-dimensional epitaxy in the lateral direction occurs fairly easily. Thus, the external waveguide layer can grow smoothly.

The overhang length is set at about 0.2 to 1.0 μm as mentioned above. If it is 0.2 μm or less, a gap G will be formed between the active waveguide layer 3-1 and the external waveguide layer 7-1 in a manner similar to the conventional examples. If it is 1.0 μm or more, the edge projecting portions of the depression layer 4-1 will be broken. Since the depression layer 4-1 is as thin as about, e.g., 0.1 to 0.3 μm, it would be broken if the overhang length were to be set at 1.0 μm or more. If the depression layer is broken, the advantages of the present invention are of course lost.

DETAILED DESCRIPTION OF THE PREFERRED EMBODIMENT

Figure 1:
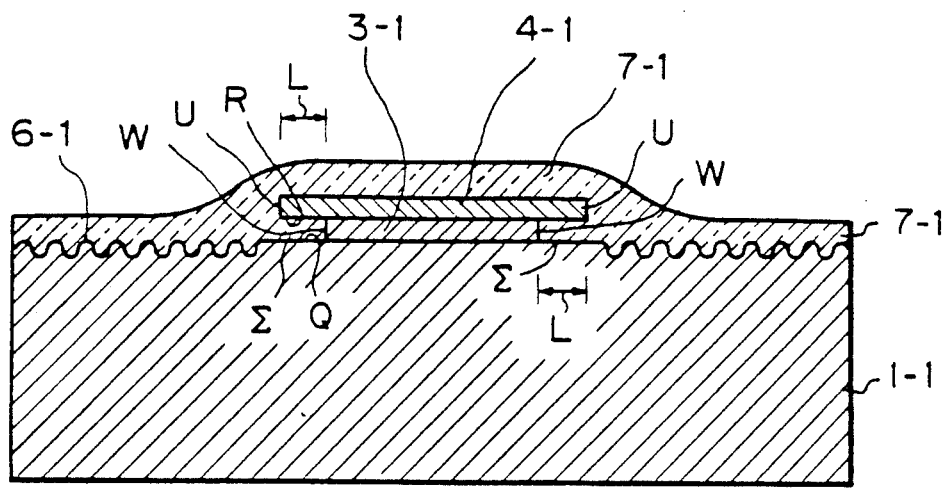
FIG. 1 is a diagram of the principle of a distributed Bragg reflector type semiconductor laser according to the present invention.

A method of manufacturing a distributed Bragg reflector type semiconductor laser according to the present invention will be described in detail hereinbelow with reference to FIGS. 2 to 8.

(1) A p-type InP buffer layer 2, an InGaAsP active waveguide layer (non-dope) 3, and an n-type InP depression layer 4 are sequentially formed and grown on a p-type InP substrate 1 by liquid phase epitaxy or vapor phase epitaxy. This growth step relates to the first epitaxy shown in FIG. 2.

An InGaAsP anti-meltback layer can also be inserted between the non-doped InGaAsP active waveguide layer 3 and the n-type InP depression layer 4 so as to make the interface smooth.

The p-type InP buffer layer 2 corresponds to the portion designed to form a diffraction grating and has a thickness of 1 to 4 μm.

The non-doped InGaAsP active waveguide layer 3 corresponds to the portion which emits the light when excited by a current supply. This layer is as thin as about 0.1 to 0.4 μm.

The n-type InP depression layer 4 protects the layer 3; however, its thickness is limited to about 0.05 to 0.3 μm so that an overhang structure is formed. It is desirable to set this thickness at a value of 0.1 μm or more so that the overhang has sufficient strength. However, it is preferable to make the depression layer 4 as thin as possible in order to raise the coupling efficiency of the waveguides.

InGaAsP is a mixed crystal in which a mixture ratio of In and Ga and mixture ratio of As and P are used as parameters. However, these two parameters cannot be freely set because the appropriate lattice match with InP must be realized. The degree of freedom is 1.

Since one degree of freedom is left, a band gap or the like can be selected by changing the mixture ratio.

In this specification, mixture ratios x and y or the like are omitted to avoid the complexity involved when they are written as suffixes.

(2) Next, a stripe-shaped SiN film 5 is formed on the n-type InP depression layer 4.

The portion of the depression layer 4 which is not covered by the SiN film 5 is etched by an etching liquid of the HCl-based.

Next, the portion of the non-doped InGaAsP active waveguide 3 which is not covered by the SiN film 5 is etched by an etching liquid of the $H_2SO_4$-based.

In this case, a selective etching process is used. An etching liquid of the $H_2SO_4$-based does not act on the n-type InP depression layer 4. The etching liquid of the HCl-based does not act on the non-doped InGaAsP active waveguide 3.

Figure 3:
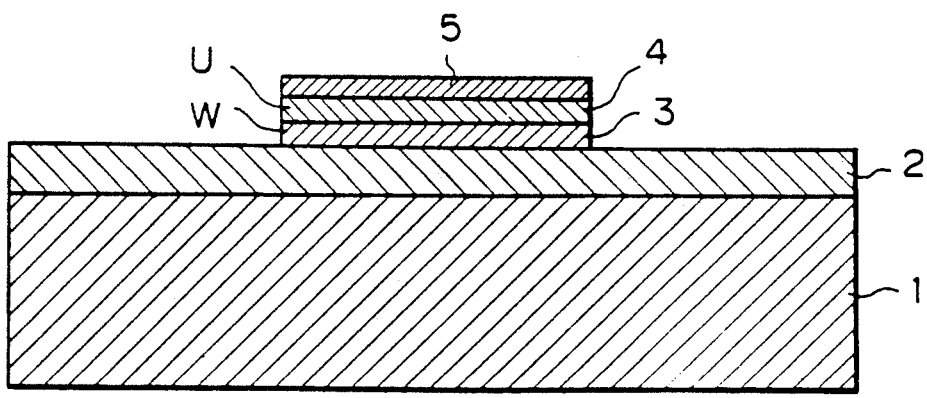
FIG. 3 is a cross-sectional view showing the state after the etching of the depression layer and active waveguide layer in the form of a stripe after formation of an SiN film.

The edge surfaces W and U of the active waveguide layer 3 and depression layer 4 become a flush surface through the above etching process. FIG. 3 shows the steps taken to reach this state. The width of a stripes is about 200 to 400 μm.

Figure 4:
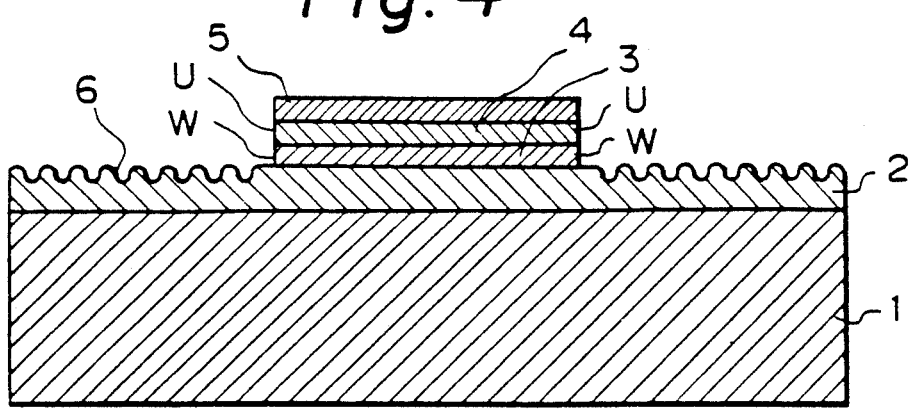
FIG. 4 is a cross-sectional view showing the state in which a distributed Bragg reflector is formed on the buffer layer.

(3) A diffraction grating serving as a distributed Bragg reflector 6 is formed on the exposed p-type InP buffer layer 2 by using an interference exposing method. This state is shown in FIG. 4.

The edge surfaces of the SiN film 5, n-type InP depression layer 4, and non-doped InGaAsP active waveguide layer 3 become a flush surface. The distributed Bragg reflector 6 is extended to the right and left from the edge surface of the active waveguide layer 3.

The grating interval of the reflector 6 is determined by the light emitting wavelength of the laser.

(4) Next, the active waveguide layer 3 is etched inwardly from the edge surface by using the $h_2SO_4$-based etching liquid in which the n-type InP depression layer 4 is used as a mask. The $H_2SO_4$-based etching liquid 4 consists of $H_2SO_4$, $H_2O_2$ and $H_2O$ and does not ct on the n-type InP depression layer 4, which allows the selective etching to be accomplished. The etching speed can be controlled by changing the component ratio of the etching liquid. For example, the etching speed may be set to about 0.1 μm/minute and, generally, to a value within the range of 0.02 to 0.2 μm/minute.

The etching depth in the lateral direction corresponds to the overhang length L. This dimension is set to about 0.2 to 1.0 μm as mentioned above.

Figure 5:
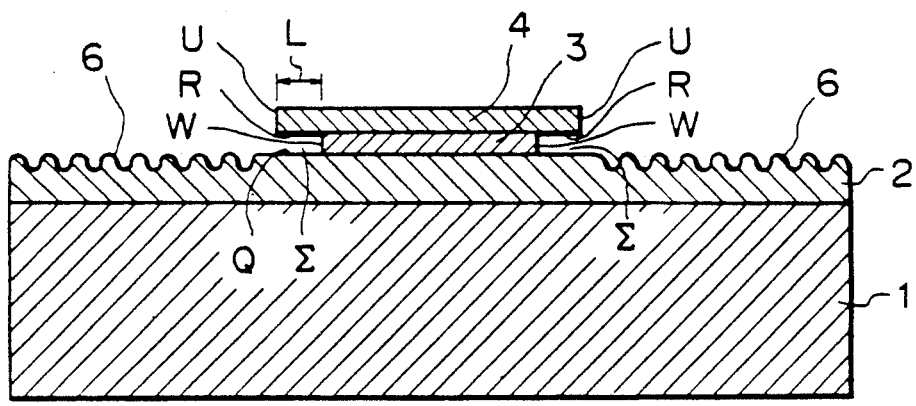
FIG. 5 is a cross-sectional view of the state after selective etching of the edge surfaces of the active waveguide layer in the lateral direction.

This state is shown in FIG. 5.

(5) Next, an n-type InGaAsP external waveguide layer 7 is grown on the upper surfaces of these layers by liquid or vapor phase epitaxy.

The InGaAsP material efficiently enters the space Σ of the overhang structure and crystal grows continuously from the edge surfaces W of the non-doped InGaAsP active waveguide layer 3.

The space Σ is a long narrow space in the lateral direction in which the depth is set at 0.2 to 1.0 μm and the height at 0.1 to 0.4 μm. The solution or gas flow can efficiently enter this space and the epitaxial growth occurs from the edge surfaces W without leaving any air gap.

In this manner, the n-type InGaAsP external waveguide layer 7 becomes a layer which covers both the n-type InP depression layer 4 and the distributed Bragg reflector 6 and extends continuously. The thickness of the external waveguide layer 7 on the upper surface of the depression layer 4 is about 0.1 to 0.4 μm.

Additionally, an n-type InP clad layer 8 is grown on the external waveguide layer 7 by liquid or vapor phase epitaxy.

The thickness of n-type InP clad layer 8 is set at about 1.0 to 3 μm.

Figure 6:
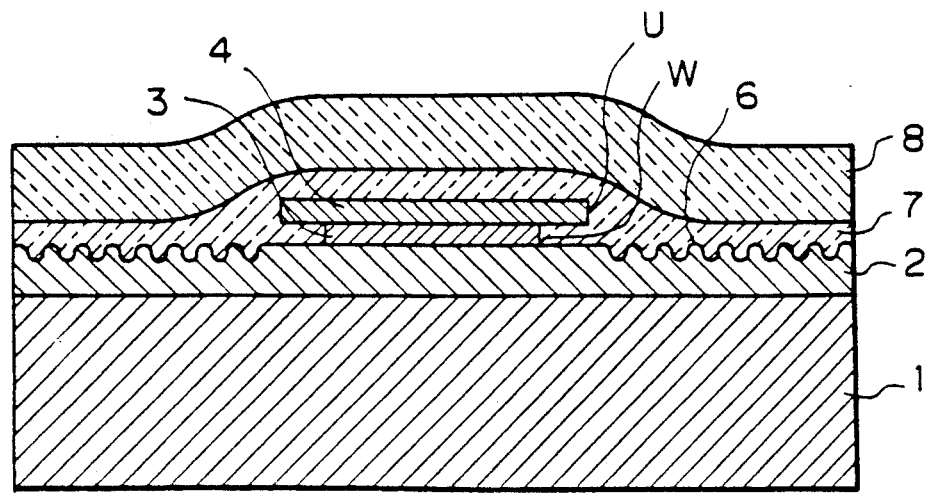
FIG. 6 is a cross-sectional view of the state after epitaxial growth of an external waveguide layer and a clad layer.
Figure 7:
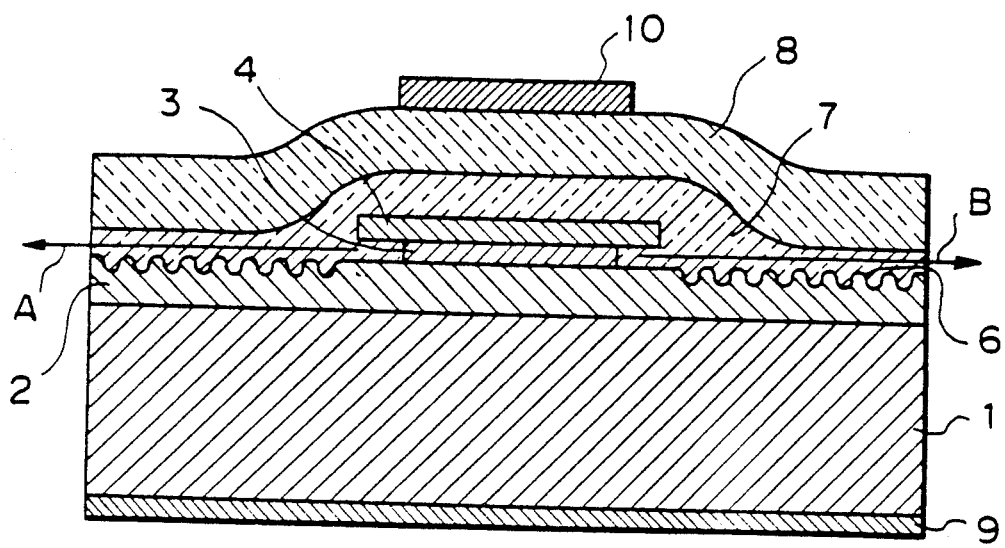
FIG. 7 is a cross-sectional view showing the state in which a P-sided electrode and an N-sided electrode are formed.
Figure 8:
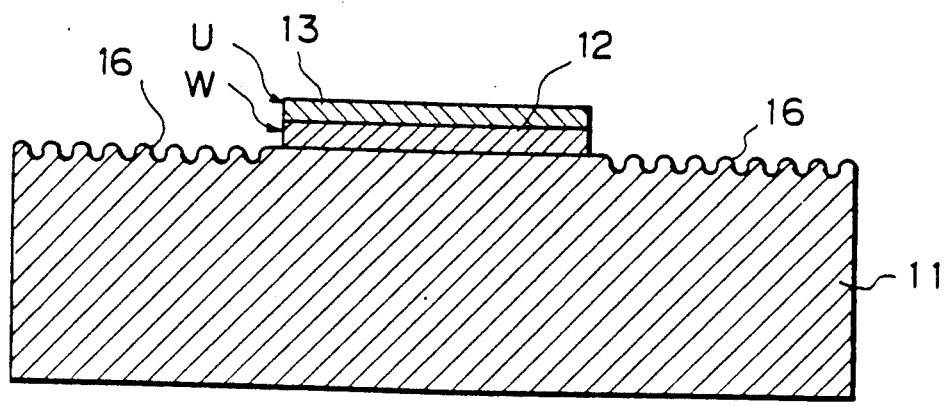
FIG. 8 is a cross-sectional view showing the state in which an active waveguide layer and a depression layer are formed by epitaxial growth on a substrate in a conventional method of manufacturing a BIG-DBR type laser and, thereafter, the active waveguide layer and depression layer are etched in the form of a stripe.
Figure 9:
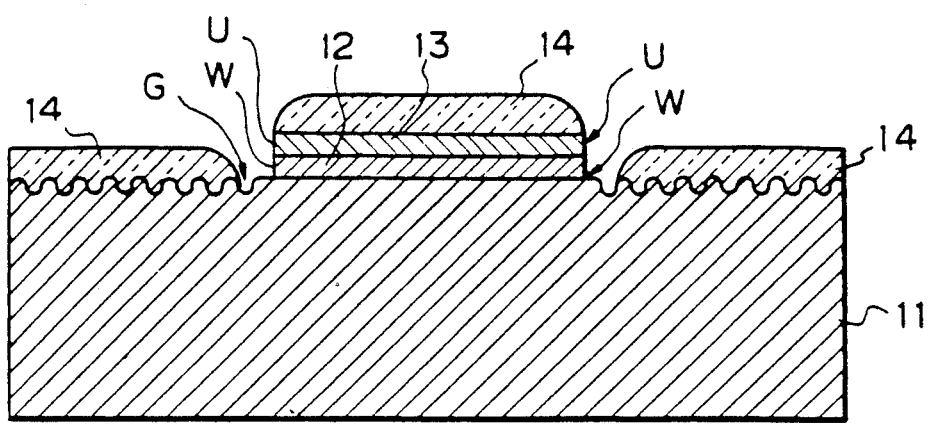
FIG. 9 is a cross-sectional view showing an example in which, when an external waveguide layer is formed by epitaxial growth on an active waveguide layer and a depression layer in a conventional method of manufacturing a BIG-DBR type laser, air gaps are formed between the active waveguide layer and the external waveguide layer, the upper surface thus becoming discontinuous.
Figure 10:
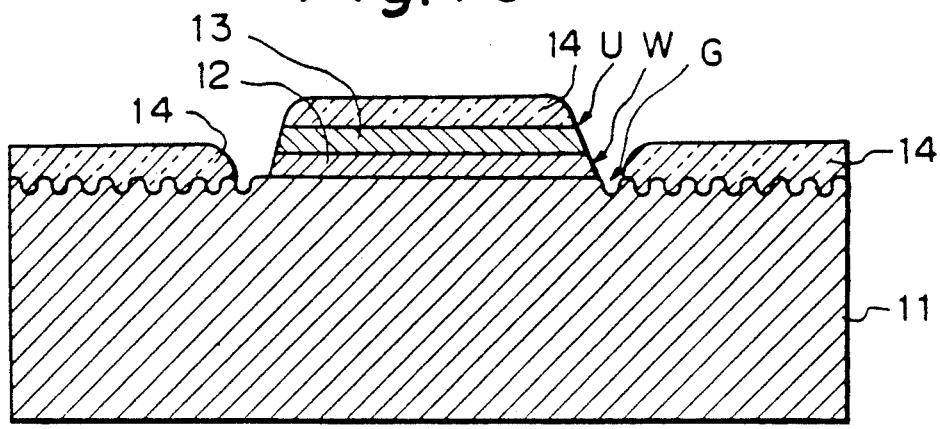
FIG. 10 is a cross-sectional view showing an example in which air gaps are formed between the active waveguide layer and the external waveguide layer in a manner similar to FIG. 9 but in which the edge surfaces of the active waveguide layer and depression layer are inclined.
Figure 11:
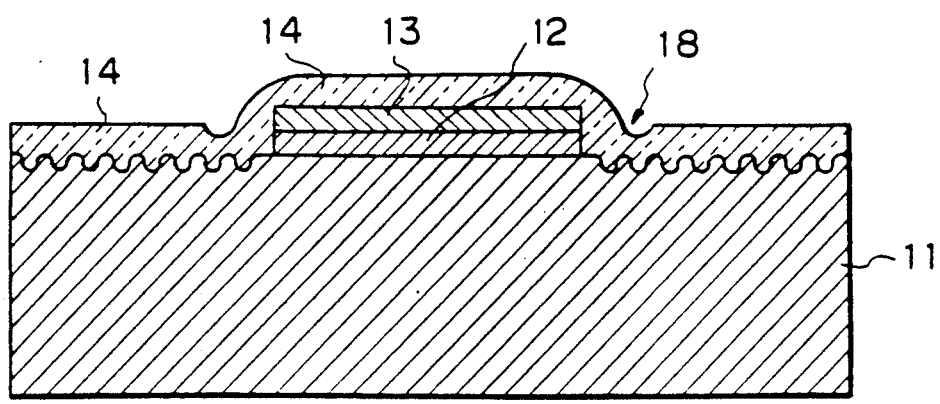
FIG. 11 is a cross-sectional view showing an example in which the active waveguide layer and external waveguide in a conventional method of manufacturing a BIG-DBR type laser are connected but dimples are formed therebetween.

FIG. 6 shows a product formed using the above steps.

The band gap of external waveguide layer 7 is set to wider than that of the active waveguide layer 3. This is because, since the mixed crystal ratio of InGaAsP has one freedom parameter, the band gap can be adjusted by changing the mixed crystal ratio.

The foregoing relation of the band gaps is set so that the light generated by the active waveguide layer 3 is not absorbed by the external waveguide layer 7.

(6) Further, a P-sided electrode 9 is formed under the InP substrate 1 and an N-sided electrode 10 is formed on the InP clad layer 8. The N-sided electrode 10 is formed as a stripe to thereby limit the current distribution.

The distributed Bragg reflector type semiconductor laser of the invention is manufactured in this manner.

After that, a wafer is scribed to obtain device chips. These chips are mounted on a package. When a current flows between the P- and N-sided electrodes, light is generated in the active waveguide layer 7 due to the stimulated emission. This light progresses to the external waveguide layer 7 in the same plane and part of the light is reflected by the function of the distributed Bragg reflector 6. By repeating this reflection, the laser power is raised. Part of the light is emitted to the exterior from the external waveguide layer 7 as shown by arrows A and B in FIG. 7.

In the distributed Bragg reflector type semiconductor laser manufactured as described above, the non-doped InGaAsP active waveguide layer 3 and n-type InGaAsP external waveguide layer 7 are effectively coupled. The consistency between the two waveguides is good.

A laser of the basic type and a manufacturing method thereof have been described above.

The laser described above is manufactured by a method wherein the n-type depression layer, the n-type external waveguide layer, and n-type clad layer are formed by epitaxial growth on the p-type InP substrate.

It is also possible to grow a p-type depression layer, a p-type external waveguide layer, and a p-type clad layer on the n-type InP substrate by reversing the electrical polarities.

The buffer layer 2 is provided to form a diffraction grating. A diffraction grating can be also formed on the surface of the substrate excluding the buffer layer.

The structure of the distributed Bragg reflector type semiconductor laser of the invention can also be used together with an embedded structure of the type generally used (for instance, refer to Asahi et al, "Journal of Applied Physics", Vol. 55(3), 1984 pages 656 to 659).

The above description relates to the distributed Bragg reflector type laser of the InGaAsP system formed on an InP substrate. However, the invention can be also applied to a laser of the GaAs system formed on a GaAs substrate.

The method of manufacturing the distributed Bragg reflector type semiconductor laser of the invention will be more specifically explained by concrete example.

Figure 2:
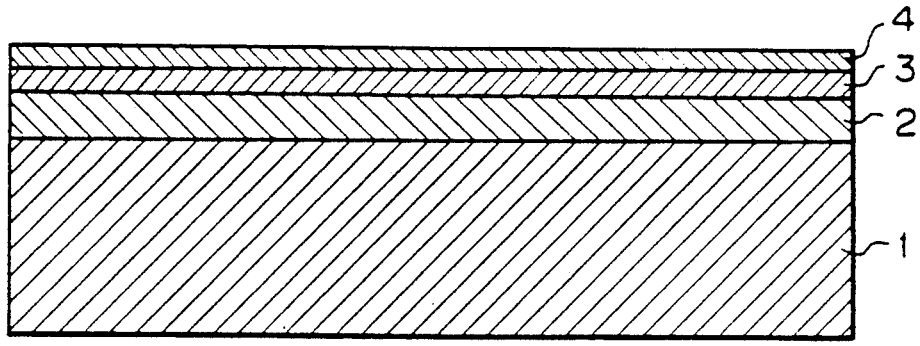
FIG. 2 is a cross-sectional view showing a state in which a buffer layer, an active waveguide layer, and a depression layer are eiptaxially grown on an InP substrate.

1) As shown in FIG. 2, p-type InP buffer layer 2  2 μm non-doped InGaAsP active waveguide layer 3 . . . 0.15 μm n-type InP depression layer 4  0.1 μm were grown on a p-type InP substrate by liquid phase epitaxy.

2) A SiN film pattern 5 having a width of 300 μm was formed as a stripe. This stripe pattern was formed in parallel with the (01̄1) plane.

An n-type InP depression layer 4 was selectively removed by a HCl-based etching liquid and the non-doped InGaAsP active waveguide layer 3 was then selectively removed by $H_2SO_4$-based etching liquid, thereby obtaining the state shown in FIG. 3.

3) The distributed Bragg reflector 6 was formed on the exposed p-type InP buffer layer 2 by the interference exposing method whereby the state shown in FIG. 4 was obtained.

4) The SiN film 5 was removed. The edge surfaces of the non-doped InGaAsP active waveguide layer 3 were etched to a depth of 0.3 μm toward the portions set back by using the $H_2SO_4$-based etching liquid, the InP depression layer 4 being used as a mask.

The component ratios of $H_2SO_4$, $H_2O_2$ and $H_2O$ were adjusted so as to obtain an etching speed of 0.1 μm/minute.

During the etching process, the etching liquid was stirred in the direction parallel to the direction of the stripe (FIG. 5).

5) On the distributed Bragg reflector 6 and buffer layer 2, n-type InGaAsP external waveguide layer 7 . . . 0.2 μm (thickness on the depression layer)

n-type InP clad layer 8 . . . 1.5 μm were grown by liquid phase epitaxy. The band gaps were set as follows.

band gaps of the InGaAsP external waveguide layer 1.0 eV band gaps of the InGaAsP active waveguide layer 0.8 eV This state corresponds to FIG. 6.

6) Next, the P-sided electrode 9 and N-sided electrode 10 were formed.

The resultant semiconductor laser offered the following advantages.

1) Since the edge surfaces of the active waveguide layer are located at positions set back behind the edge surfaces of the depression layer so as to form an overhang structure, no air gap remained between the edge surfaces W of the active waveguide layer and the external waveguide layer when the external waveguide layer was formed by epitaxial growth.

2) Since no air gap remains and the active waveguide layer and external waveguide layer are intimately connected, the product yield is high. Semiconductor lasers manufactured by the method of the invention were evaluated in terms of yield on the basis of the coupling state of the waveguides. It was found that a yield of 90% or better was obtainable.

In contrast, when the edge surfaces become a flush surface as shown in FIG. 8 to 11, the yield obtainable was close to 0, i.e., 0% to a few %.

The invention offers remarkably improved yields, a high product yield being a very important factor for industry.

3) Since the coupling efficiency is high, the light emission efficiency rises greatly when the laser of the invention is used as a semiconductor laser.

4) The invention can also be applied to GaAs system semiconductor lasers, as well as InP system semiconductor lasers.

5) Since the laser of the invention is of the DBR type, it can be monolithically integrated with other functional devices with ease.

The invention is not limited to semiconductor lasers; it can also be applied to other devices such as optical ICs and the like.

Although the present invention has been illustrated and described with respect to a preferred embodiment, various changes and modifications which are obvious to a person skilled in the art to which the invention pertains are deemed to lie within the spirit and scope of the appended claims which define the invention.

What is claimed is:

1. A method of manufacturing a distributed Bragg reflector type semiconductor laser comprising the steps of:

forming a buffer layer (2) on a p- or n-type semiconductor monocrystalline substrate (1) by an epitaxial growth method, said buffer layer (2) having the same electrical polarity as said substrate (1);

forming by epitaxial growth a non-doped active waveguide layer (3) on said buffer layer (2), or on said substrate (1) in the case where no buffer layer is interposed;

forming by epitaxial growth a depression layer (4) having an electrical polarity opposite to that of said substrate (1) on said non-doped active waveguide layer (3);

forming a stripe-shaped film (5) in a central portion of an upper surface of said depression layer (4);

etching both the depression layer (4) and the active waveguide layer (3) while retaining the central portion covered by said film (5);

forming a distributed Bragg reflector (6) serving as a diffraction grating on upper surfaces of the remaining depression layer (4) and the buffer layer (2) which is exposed on both sides of said active waveguide layer (3) or on the upper surface of the substrate (1) by use of an interference exposing method;

etching edge surfaces of the active waveguide layer (3) in the horizontal direction by using the depression layer (4) as a mask, thereby allowing edge surfaces (W) of the active waveguide layer (3) to be set back by a distance of 0.2 μm to 1.0 μm behind edge surfaces (U) of the depression layer (4);

forming by epitaxial growth on the buffer layer (2) or the substrate (1) with said distributed Bragg reflector (6) formed thereon and on the depression layer (4) an external waveguide layer (7) having an electrical polarity opposite to that of the substrate (1);

forming by epitaxial growth on said external waveguide layer (7) a clad layer (8) having an electrical polarity opposite to that of the substrate (1); and forming electrodes (9) and (10) on the substrate (1) and said clad layer (8).

2. A method according to claim 1, wherein said epitaxial growth method is a liquid phase epitaxial growth method.

3. A method according to claim 1, wherein said epitaxial growth method is a vapor phase epitaxial growth method.

4. A method according to claim 2 or 3, wherein said substrate (1) is a p-type InP monocrystal, said buffer layer (2) is a p-type InP monocrystal; said active waveguide layer (3) is a non-doped InGaAsP mixed crystal, said depression layer (4) is an n-type InP monocrystal, said external waveguide layer (7) is an n-type InGaAsP mixed crystal, and said clad layer is an n-type InP monocrystal.

5. A method according to claim 4, wherein said depression layer (4) is selectively etched by an HCl-based etching liquid and said active waveguide layer (3) is selectively etched by an $H_2SO_4$-based etching liquid.

6. A method according to claim 5, wherein when the edge surfaces (W) of said active waveguide layer (3) are etched in a lateral direction, the etching speed falls within a range from 0.02 μm/minute to 0.2 μm/minute.

* * * * *